(12) United States Patent
Ishida et al.

(10) Patent No.: US 6,408,934 B1
(45) Date of Patent: Jun. 25, 2002

(54) COOLING MODULE

(75) Inventors: Yoshio Ishida; Akimi Shutou; Takao Terasaka, all of Osaka (JP)

(73) Assignee: Diamond Electric Mfg. Co., Ltd., Osaka (JP)

( * ) Notice: Subject to any disclaimer, the term of this patent is extended or adjusted under 35 U.S.C. 154(b) by 0 days.

(21) Appl. No.: 09/318,792

(22) Filed: May 26, 1999

(30) Foreign Application Priority Data

| May 28, 1998 | (JP) | ................................... 10-166297 |
| Sep. 21, 1998 | (JP) | ................................... 10-285906 |
| Oct. 14, 1998 | (JP) | ................................... 10-291701 |

(51) Int. Cl.[7] ............. F28F 7/00; F28D 15/00; H01L 23/34; H05K 7/20
(52) U.S. Cl. ............... 165/80.3; 165/104.33; 257/722; 361/700
(58) Field of Search .............. 165/80.3, 104.33, 165/185; 257/722, 715; 361/697, 700

(56) References Cited

U.S. PATENT DOCUMENTS

| 4,414,604 A | * | 11/1983 | Matsui et al. ............. 165/80.3 |
| 5,268,812 A | * | 12/1993 | Conte ..................... 165/104.33 |
| 5,409,055 A | * | 4/1995 | Tanaka et al. ........... 165/104.33 |
| 5,508,908 A | * | 4/1996 | Kazama et al. ............ 165/80.3 |
| 5,760,333 A | * | 6/1998 | Kitahara et al. ........... 165/80.3 |
| 5,784,256 A | * | 7/1998 | Nakamura et al. ...... 165/104.33 |
| 5,917,699 A | * | 6/1999 | Hung et al. ................. 361/697 |
| 5,946,190 A | * | 8/1999 | Patel et al. ................. 361/700 |
| 5,960,866 A | * | 10/1999 | Kimura et al. ............ 165/80.3 |
| 5,966,286 A | * | 10/1999 | O'Connor et al. ......... 165/80.3 |
| 5,978,219 A | * | 11/1999 | Lin ............................. 361/697 |
| 5,983,995 A | * | 11/1999 | Shutou et al. .............. 165/185 |
| 6,069,791 A | * | 5/2000 | Goto et al. ............. 165/104.33 |

* cited by examiner

Primary Examiner—Henry Bennett
Assistant Examiner—Tho Duong
(74) Attorney, Agent, or Firm—Liniak, Berenato, Longacre & White

(57) ABSTRACT

A cooling module is disclosed which comprises a plate, a flat heat pipe, a directional motor, and a fin structure, wherein at least a part of the heat pipe is embedded into the plate while being flush with plate, and the heat pipe is disposed close to a heat generating object and a coupling portion of the fin structure.

1 Claim, 12 Drawing Sheets

COOLING MODULE

BACKGROUND OF THE INVENTION

The present invention relates to a cooler module in use with an electronics device, such as a personal computer. More particularly to a thin cooler module of an MCM, such as a higher performance MPU module, which rapidly increases its market share recently.

In a personal computer as a typical product of those electronics information devices, an MPU and its peripheral ICs are separately mounted on a mother board. With recent data processing trend of processing a great amount information at high speeds, the computing speed or frequency of the computer is rapidly increasing on the month-by-month basis. In this circumstance, noise generated is problematic, and an MPU module containing an MPU and its peripheral IC is widely used.

Use of the MPU module is an effective measure for the high spped data processing and noise. However, it creates another problem, or heat generation since the MPU module is an integration of heat-generating elements.

The current products trend reduction of the product size and weight. In those products, a number of electronic parts, or heat generating elements must be confined within a housing having a limited inner space. Thus, the module is a hot spot, and adversely affects its peripheral parts. And discharging heat out of the housing is technically difficult.

SUMMARY OF THE INVENTION

Accordingly, an object of the present invention is to a thin cooling module which is thin and has high performances by eliminating such protrusions and recesses to impede an air flow by forming a heat sink having a good heat uniformity, and makes it easy to design MPU modules.

Another object of the present invention is to to efficiently radiate heat without increase the number of revolutions of a fan motor by systematizing the functions of individual components of a cooling module.

According to the 1st to the 9th aspects of the invention, there is provided a cooling module having a plate, a flat heat pipe, a directional motor, and a fin structure, the improvement being characterized in that at least a part of the heat pipe is embedded into the plate while being flush with plate, and the heat pipe is disposed close to a heat generating object and a coupling portion of the fin structure. In the cooling module, the fin structure may be coupled to one end of the plate while being disposed parallel to an exhaust port of the fan motor. At least two plates are combined into the plate, and a part of the plate located in an air path is cut to form a fin structure. The fin structure is directly coupled onto the surface of the heat pipe.

Further, the fin structure is detachably formed on a spring table with coupling means, the width of the spring table being substantially equal to that of the heat pipe. A part of the base of the fan motor is processed to form the fin structure. A part of a fan motor cover is processed to form the fin structure.

A fan motor cover is extended at least to a part of the fin structure to for an air guide. A heat radiation portion of the heat pipe is bonded to the fan motor cover.

According to the 10th to the 14th aspects of the invention, there is provided a cooling module having a collector, a flat heat pipe, a fin structure and a plate, the improvement being characterized in that one end of the heat pipe is embedded into the collector while being flush with the collector, a surface portion of the heat pipe continuous to the flat surface of the collector is bonded to the plate including a cut-out portion to which the heat pipe is embedded, and the fin structure and the plate are coupled together to the other end of the heat pipe.

According to yet another aspect, there is provided a cooling module having a collector, a flat heat pipe, a fin structure and a plate, the improvement being characterized in that one end of the heat pipe is embedded into the collector while being flush with the collector, the other end of the heat pipe is embedded into the fin structure while being flush with the fin structure, a surface portion of the heat pipe continuous to the flat surfaces of the collector and the fin structure is bonded to the plate including a cut-out portion to which the heat pipe is embedded.

In the cooling module, the thickness of the flat heat pipe is substantially equal to that of the plate. The base of the fan motor is made of metallic material, and the metal base is used for the fin structure. The fin structure is constructed such that the fin structure modulates an air flow received into an air flow having a direction.

According to the 15th to the 19th aspects of the invention, there is provided a cooling module having a plate, a heat pipe and a fan motor capable of causing a directional air flow, the improvement being characterized in that a duct of the fan motor is constructed with the plate and a cover having an air-suction opening for the fan motor, at least one fin which is extended from the plate and coupled at its end to the cover is located in the vicinity of a blow-out port of the duct, and the heat pipe is disposed ranging from a portion near the fin of the plate to a heat receiving portion.

In the cooling module, at least a part of the heat pipe is flat. The heat pipe defined in the 18th aspect is partly or entirely embedded into the plate.

According to the 20th aspect of the invention, there is provided a cooling module wherein a collector for receiving heat from a heat generating object, a fan motor capable of causing a directional air flow, and blades and a fin structure are disposed on a plate, an air guide is disposed surrounding at least the fan motor and the blades on the plate, and a cover is applied to the air guide so as to form a duct, a heat pipe and a groove for receiving the heat pipe are provided on and in the lower surface of the plate, while making a detour around a position used for mounting the motor fan, the heat pipe and the groove ranging from the collector to the duct, and a cover made of good heat conduction is applied to the upper side of the fin structure.

DETAILED DESCRIPTION OF THE PREFERRED EMBODIMENTS

Figure 1:
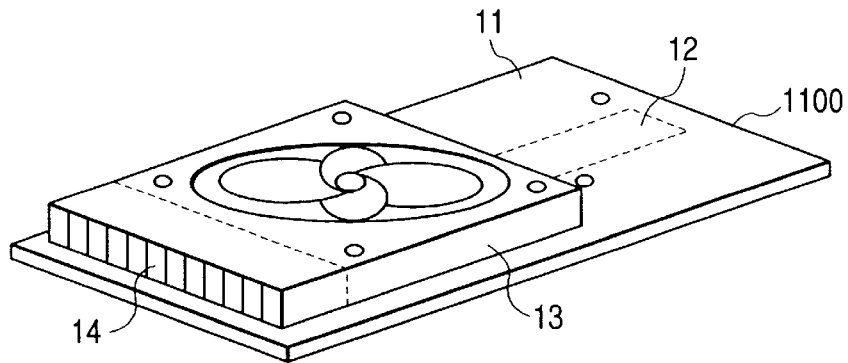
FIG. 1 is a perspective view showing a cooling module which is the 1st embodiment of the present invention.
Figure 2:
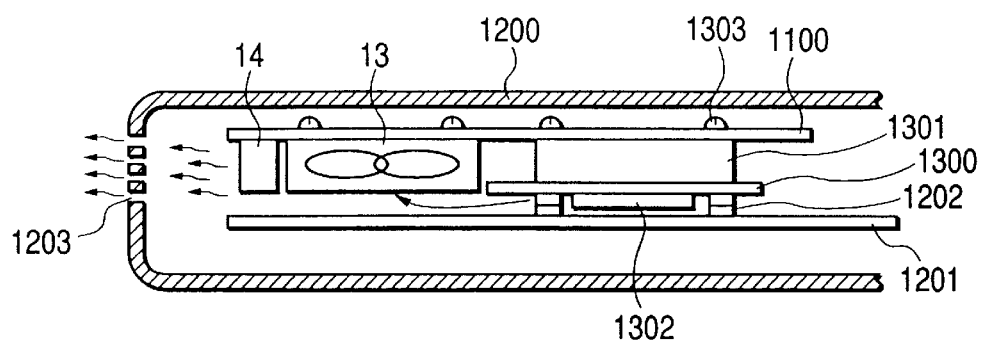
FIG. 2 is a sectional view showing a structure of a portable, battery-powered computer into which the cooling module is assembled.

FIG. 1 is a perspective view showing a cooling module 1100 which is the 1st embodiment of the present invention. FIG. 2 is a sectional view showing a structure of a portable, battery-powered computer into which the cooling module 1100 is assembled.

In FIGS. 1 and 2, the cooling module 1100 is made up of a plate 11, a flat heat pipe 12 embed into the plate 11, a thin, directional fan motor unit 13 (referred to simply as a fan motor) having a suction port formed in the upper surface and an exhausting port formed in one of the side surfaces, and a fin structure 14 arranged parallel to the exhausting port of the fan motor 13.

The fan motor 13 is screwed to the plate 11, and the fin structure 14 is welded to the same. The heat pipe 12 is embedded in the plate 11 and thermally and mechanically fastened to the plate 11 in a manner to be described later.

The cooling module 1100 is disposed within a laptop computer as shown in FIG. 2. Within a housing 1200, an MPU module 1300 is electrically and mechanically connected to a mother board 1201 by means of connectors 1202 on the mother board. The plate 11 is thermally and mechanically coupled to the upper surface of an MPU package 1301 of the MPU module 1300 by screws 1303. In this structure, the MPU per se is a main heat-producing component, and provides a major heat source within the housing 1200.

The MPU package 1301 and a group of peripheral ICs 1302 as well are mounted on the MPU module 1300. Some of the peripheral ICs 1302 require heat radiation parts attached thereto. However, since those ICs are thermally attached to the MPU package 1301, heat radiation from those ICs is accelerated.

It will readily be understood that the cooling capability of the cooling module 110 could be improved if the fan motor 13 for the cooling module 1100 is disposed just above the MPU package 1301. However, such a layout of the fan motor 13 is rejected in a practical stage by some restrictions: the housing has a limited thickness; the coupling of the MPU package 1301 to the plate 11 is required; and the heat-resistance performance of the drive IC for and the bearing of the fan motor 13 is designed to be below 60° C. Further, to secure an efficient cooling, the exhausting port of the fan motor 13 must be disposed in the vicinity of an exhausting portion 1203 of the housing 1200. However, such a layout of the fan motor 13 is also rejected by the layout restrictions.

The heat pipe 12 is used for improving the cooling capability and the cooling efficiency. Material of the plate 11 is aluminum, and its dimensions are 60 mm (wide)×100 mm (long)×1.5 mm (high). The plate 11 receives heat about 15 W from the MPU module 1300; however, the thermal conductivity of the plate is unable to transfer the received heat of such an amount as to fully utilize the cooling capability of the fan motor 13. The flat heat pipe 12 is embedded in the plate 11 while ranging from the heat receiving portion of the plate 11 to the fin structure 14. The thus embedded heat pipe 12 is capable of dispersing the heat received from the MPU module 1300 over the substantially entire surface of the plate 11. In the structure of the cooling module, the temperature of the heat exchanging is much lower than the temperature of the heat exchanging in the case where the fan motor 13 is directly attached to the MPU module 1300. The cooling module structure including the fin structure 14 performs the heat exchange in uniform temperature conditions. Therefore, the cooling module exhibits an excellent cooling capability even if it is assembled into a hot object thick-reduction oriented in design.

Figure 3:
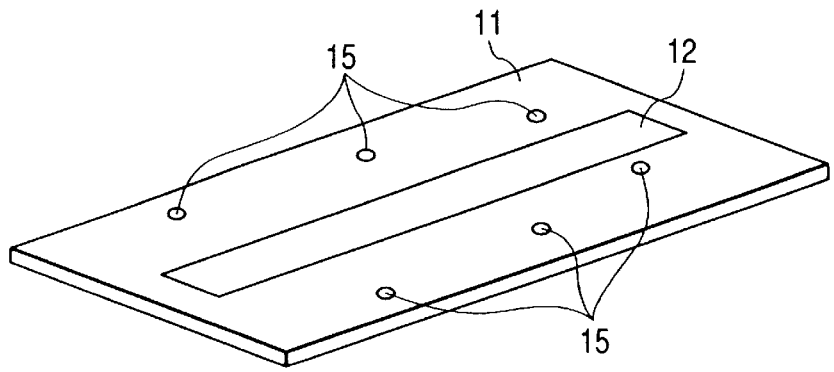
FIG. 3 is a perspective view showing a first heat pipe being embedded into a plate.
Figure 4:
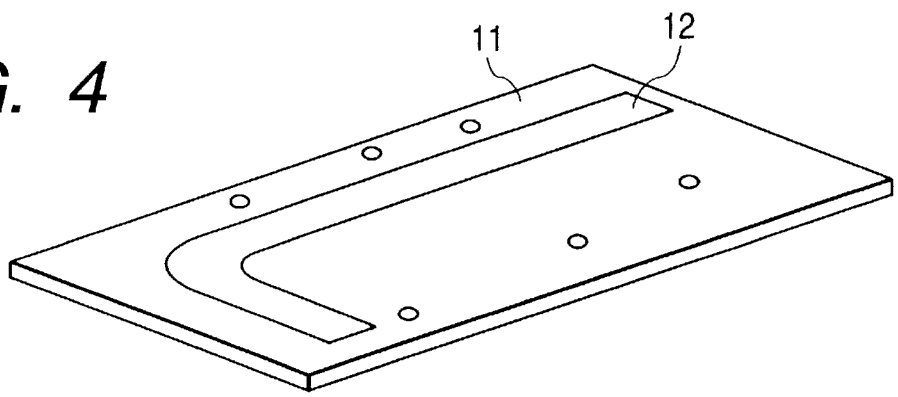
FIG. 4 is a perspective view showing a second heat pipe being embedded into a plate.
Figure 5:
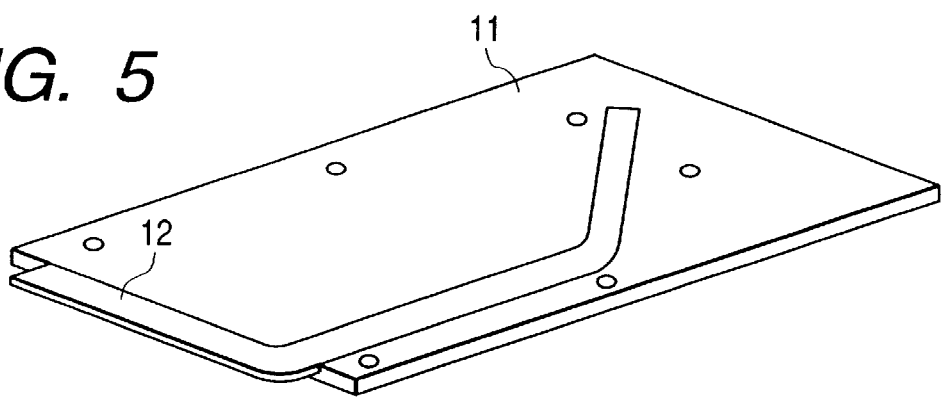
FIG. 5 is a perspective view showing a third heat pipe being embedded into a plate.

Some exemplary configurations of the flat heat pipe 12 embedded into the plate 11 are illustrated in FIGS. 3 to 5. Some exemplary methods of embedding the heat pipe 12 into the plate 11 are shown in FIGS. 6A and 6B, 7A and 7B, and 8A and 8B.

In the case of FIG. 3, a heat pipe 12 used takes the form of an elongate rectangular strip. A plurality of holes 15 are formed in a plate 11. Those holes are used when the MPU module 1300 and the fan motor 13 are mounted on the plate 11. The heat pipe 12 is laid extending over the almost entire length of the plate 11. In the case of FIG. 4, a heat pipe 12 is shaped like L (when viewed in plan) with the intention to transfer a maximum amount of heat from the MPU module 1300 to a portion of a plate 11 where a fin structure 14 is to be mounted. In the case of FIG. 5, a heat pipe 12 is shaped like U (when viewed in plan). To give a design freedom of the fin structure 14, one leg of the U-shaped heat pipe 12 is disposed outside and along one of the short sides of the plate 11, while being extended out of the plate 11 by such a distance as to allow the mounting of the fin structure 14. The other leg of the U-shaped heat pipe 12 is extended to a location closest to the MPU module 1300.

Turning to FIG. 6, there is illustrated an exemplar of the method of embedding the heat pipe 12 in the plate 11. As shown, a groove 110 is formed in the plate 11. Protrusions 111 like burrs are formed at and along the corner edges of the groove 110. The groove 110 is dimensioned so that the heat pipe 12 is fit into the groove 110 when it is inserted into the latter. The heat pipe 12 may be embedded into the plate 11 in a simple manner that the heat pipe 12 is fit into the groove 110 and the resultant structure is pressed. When pressed, the protrusions 111 are deformed to extend to the rounded, upper corners of the heat pipe 12. The heat pipe 12 is fixed into the groove 110 of the plate 11.

Figure 6A:
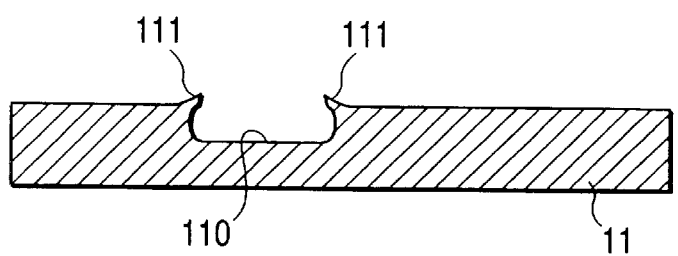
FIGS. 6A and 6B are cross sectional views showing a first way of embedding a heat pipe into a plate.
Figure 6B:
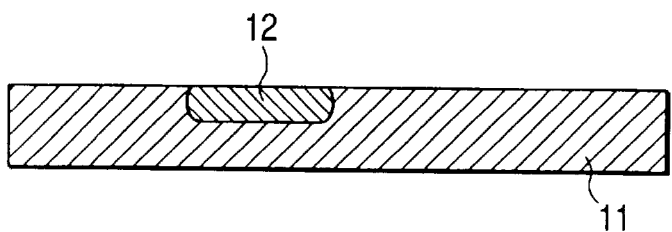
Figure 7A:
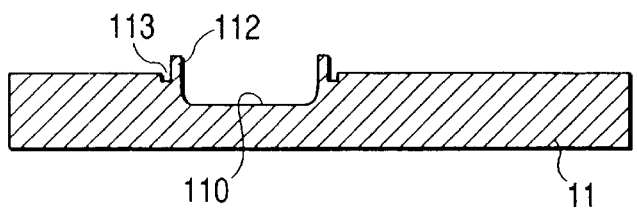
FIGS. 7A and 7B are cross sectional views showing a second way of embedding a heat pipe into a plate.
Figure 7B:
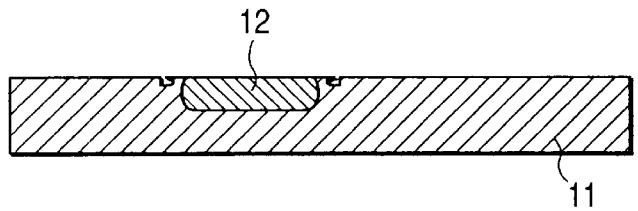

The plate 11 shaped as shown in FIG. 6A may be manufactured by an extrusion molding process. Where a die casting molding process is used, a plate 11 is preferably shaped as shown in FIG. 7A. Also in the plate 11 of FIG. 7A, protrusions are formed at and along the corner edges of the plate 11 as in FIG. 6. However, in this case, it is impossible to form the protrusions 112 in a state that those extend to the groove 110. Therefore, small grooves 113 are formed outside and along the protrusions 112 of the groove 110. The width of each small groove 113 is substantially equal to that of each protrusion 112. To embed the heat pipe 12 into the plate 11, the heat pipe 12 is fit into the groove 110, and the resultant is pressed. By pressing, the protrusions 112 are crushed to equally extend to the upper corners of the heat pipe 12 and the small grooves 113.

Figure 8A:
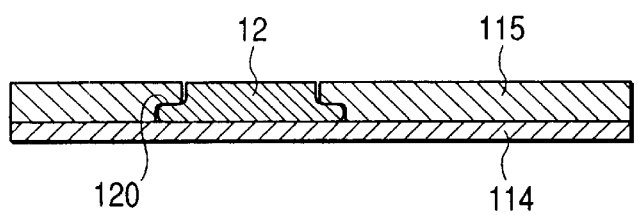
FIGS. 8A and 8B are cross sectional views showing a third way of embedding a heat pipe into a plate.
Figure 8B:
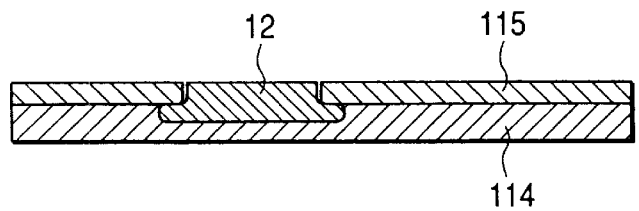

Other embedding methods are shown in FIGS. 8A and 8B. Two plates 114 and 115 are used. Fixing of the heat pipe 12 and mounting of the fin structure 14 are allocated to the plate 114. With this, the plate 114 may flexibly be shaped for receiving the heat pipe 12 and the fin structure 14 by cutting, for example. The heat pipe 12 is shaped to have stepped sides 120, and an elongated hole is formed in the plate 11, while having stepped side walls 120. The stepped side walls 120 of the heat-pipe receiving hole are shaped so as to receive the stepped sides 120 of the heat pipe 12 in a well fitting fashion when the heat pipe 12 is inserted into the heat-pipe receiving hole of the plate 11. The plates 114 and 115 may be coupled into one unit by bonding or caulking. The stepped sides 120 of the heat pipe 12 may be formed in the pressing stage for the caulking, as a matter of course.

Figure 9:
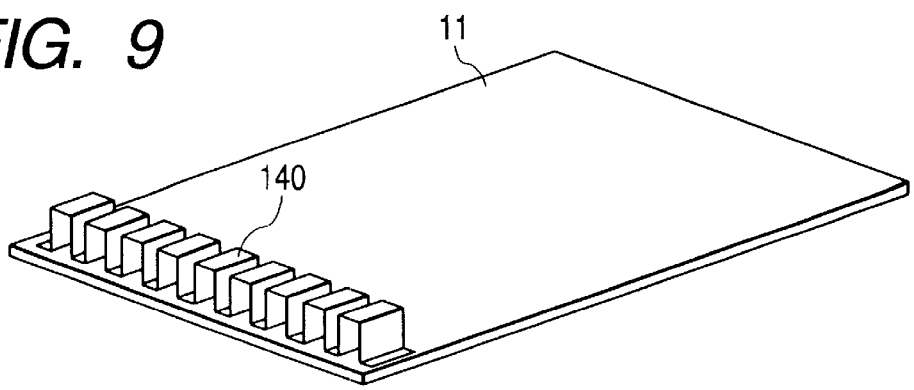
FIG. 9 is a perspective view showing a first fin structure.
Figure 10:
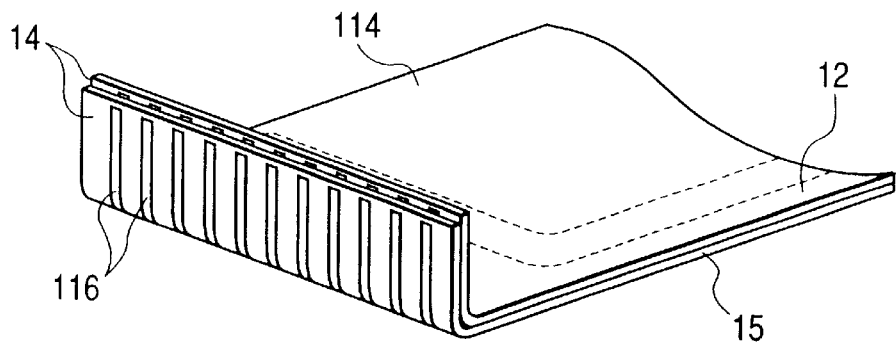
FIG. 10 is a perspective view showing a second fin structure.

The fin structure 14 will be described with reference to FIGS. 9 through 14. In the case of FIG. 9, a corrugated fin unit 140 is bonded on and along one of the short sides of the plate 11 by welding, for example. In the case of FIG. 10, one of the short sides of the laminated plates 114 and 115 (FIG. 8) are bent to be shaped like L (when viewed from side). A number of slits 116 are formed in the bent portions.

Figure 11:
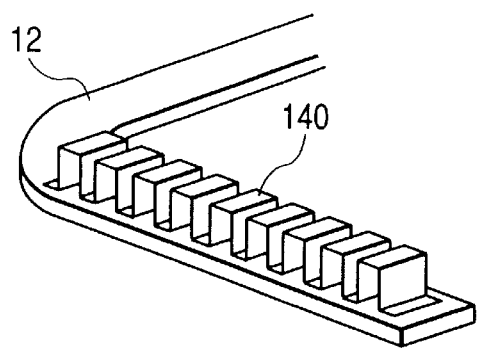
FIG. 11 is a perspective view showing a third fin structure.
Figure 12:
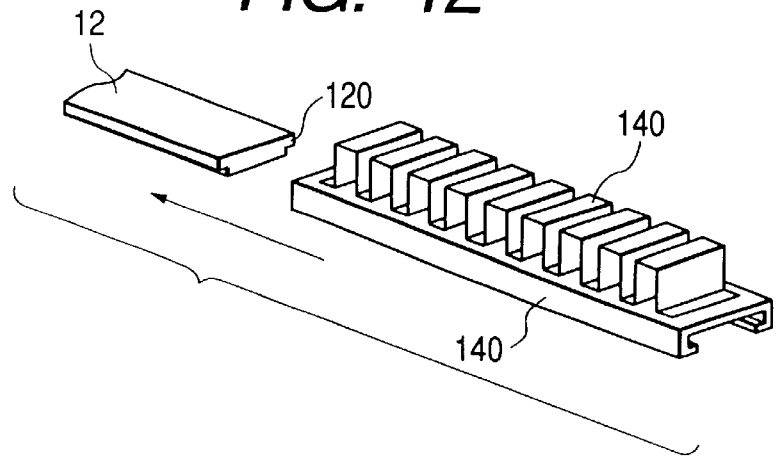
FIG. 12 is a perspective view showing a fourth fin structure.

In the case of FIG. 11, a corrugated fin unit 140 is directly bonded on the heat pipe 12 by welding, for example. In the case of FIG. 12, a corrugated fin unit 140 is welded onto a spring table 121 of which the width corresponds to that of the heat pipe 12. The heat pipe 12 includes stepped sides 120 extending over its entire length as referred to FIG. 8. The spring table 121 has a cross section shaped like a widened U so as to receive the thus shaped heat pipe 12 in a well fitting fashion when the heat pipe 12 is coupled into spring table 121. The FIG. 12 fin unit is advantageous in that it is easily coupled into and decoupled from the heat pipe 12.

Figure 13:
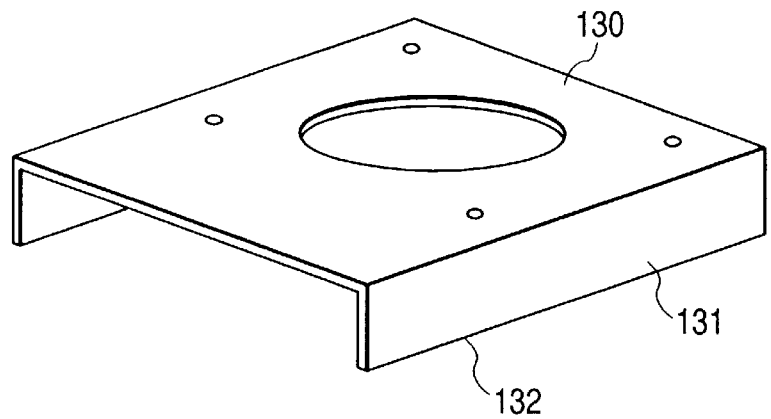
FIG. 13 is a perspective view showing a fifth fin structure.
Figure 15:
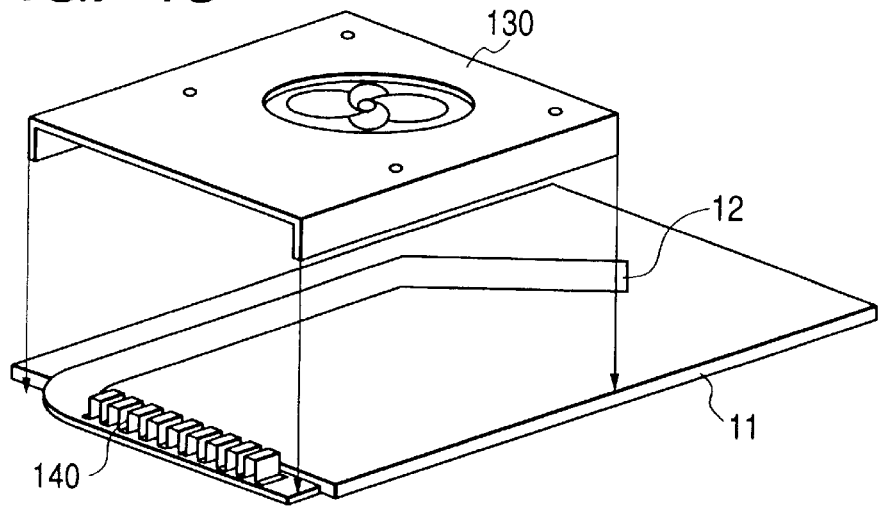
FIG. 15 is a perspective view showing a cooling module which is the 2nd embodiment of the present invention.

An air path may be formed by attaching a ceiling plate to the fin structure 14 or the corrugated fin unit 140 shown in FIGS. 9 to 12. An specific example of this is shown in FIGS. 13 and 15. A cover 130 of the fan motor 13 is shaped as shown in FIG. 13; both end portions of the cover 130 are bent at right angles to form legs 132. The thus shaped cover 130, as shown in FIG. 15, is applied to the plate 11 with the corrugated fin unit 140 attached thereto, to form an air path. Incidentally, the structure of FIG. 15 forms the 2nd embodiment of the present invention.

Figure 14A:
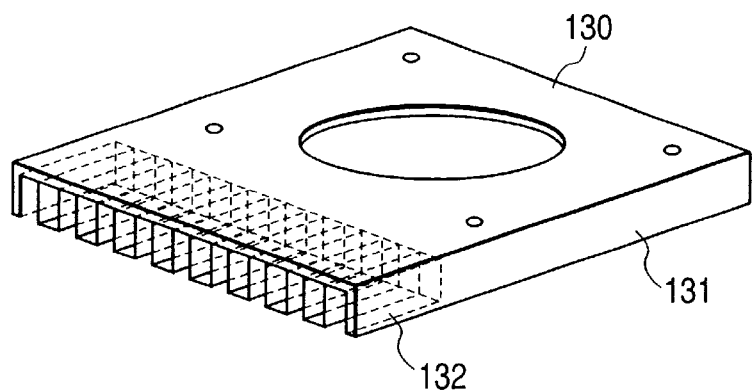
FIGS. 14A and 14B are perspective views showing a sixth fin structure.
Figure 14B:
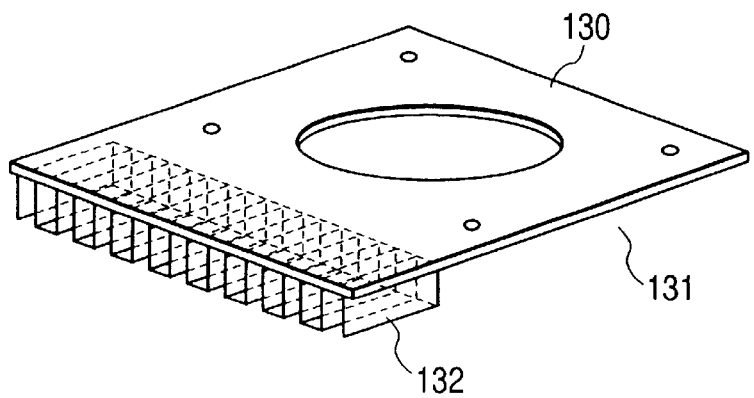

As shown in FIGS. 14A and 14B, a corrugated fin unit 140 may be welded to one end of the cover 130 of the fan motor 13, whereby a fin structure 14 is formed.

Figure 16:
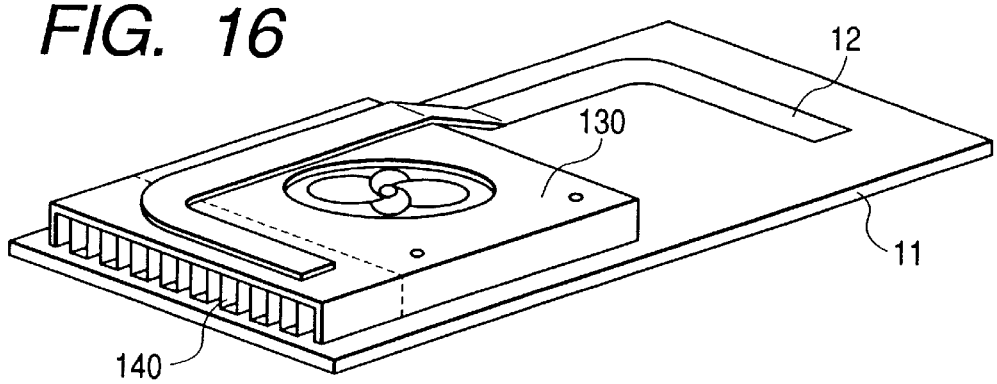
FIG. 16 is a perspective view showing a cooling module which is the 3rd embodiment of the present invention.
Figure 17:
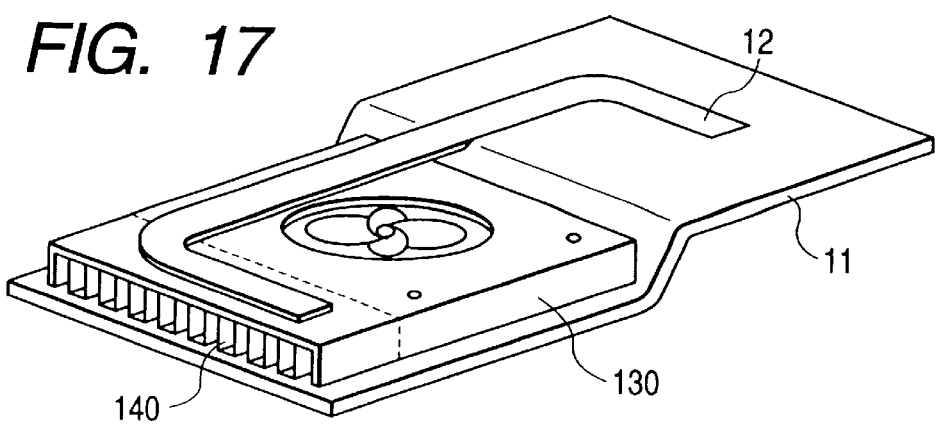
FIG. 17 is a perspective view showing a cooling module which is the 4th embodiment of the present invention.

In this case, the corrugated fin unit 140 is not coupled with the plate 11. Therefore, an insufficient amount of heat is transferred from the plate 11 to the corrugated fin unit 140, so that the corrugated fin unit 140 exhibits an insufficient heat radiation ability. To cope with this, it is preferable that the structure in which the corrugated fin unit 140 and the cover 130 are thus combined is attached to the plate 11 as shown in FIGS. 16 and 17, which are the 3rd and the 4th embodiments of the invention. As shown, a heat receiving portion of the heat pipe 12 is embedded into the plate 11, while a heat radiation portion of the heat pipe 12 is directly and thermally coupled to the fin mounting portion.

Although not illustrated, the fin structure 14 may be located between the fan motor 13 and the plate 11; it may be mounted on the base of the fan motor 13.

While the corrugated fin unit 140 is used for the fin structure 14 in the above-embodiments, it may be substituted by another known fin unit, such as an offset fin unit or an extrusion fin unit.

Figure 18:
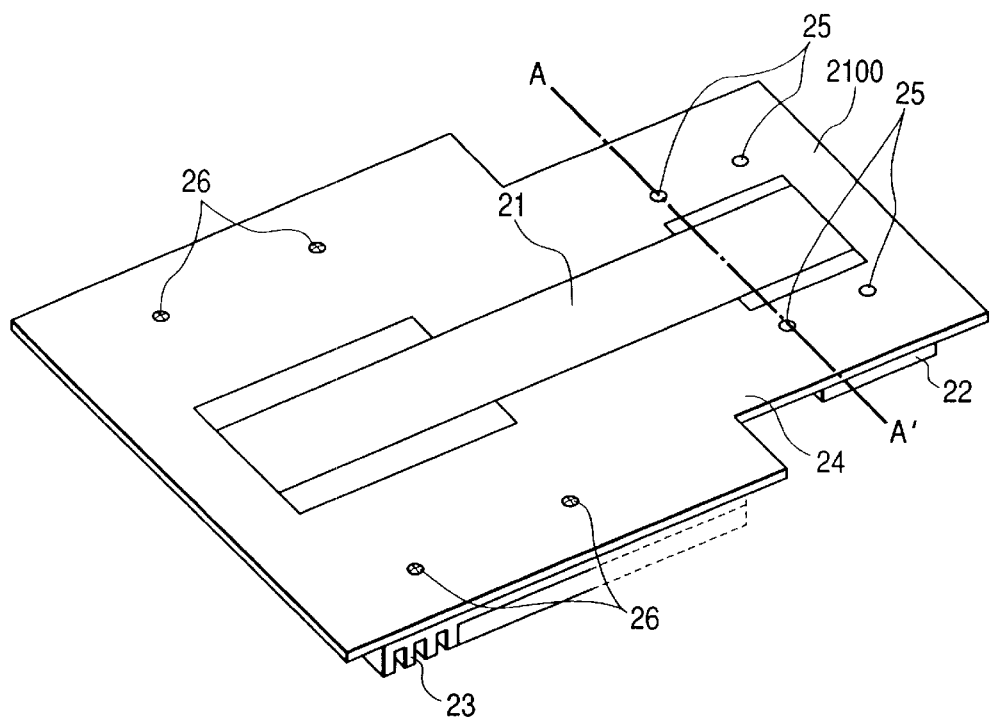
FIG. 18 is a perspective view showing a cooling module which is the 5th embodiment of the present invention.
Figure 19:
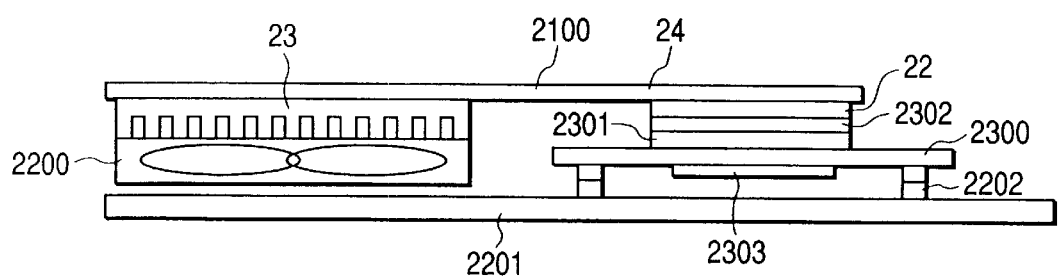
FIG. 19 is a sectional view showing a structure of a portable, battery-powered computer into which the cooling module is assembled.

FIG. 18 is a perspective view showing a cooling module which is the 5th embodiment of the present invention. FIG. 19 is a sectional view showing a structure of a portable, battery-powered computer into which the cooling module 2100 is assembled.

As shown in FIGS. 18 and 19, in a thin cooling module 2100, one end of a flat heat pipe 21 is embedded into a collector 22 and the other end of the heat pipe is embedded into the base of a fin structure 23. A surface portion of the heat pipe 21, which is continued from the flat surfaces of the collector 22 and the fin structure 23, is bonded to a plate 24 including a cut-out portion into which the heat pipe 21 is embedded.

How to couple the collector 22 to the fin structure 23 onto the plate 24 will be described. The collector 22 is coupled to the plate 24 by caulking. To this end, burring bosses 25 are formed on the plate 24. To couple the fin structure 23 to the plate 24, counter-sunk screws 26 are used. Use of the counter-sunk screws 26 lessens a chance of forming protruded objects. The heat pipe 21 is mechanically and thermally fixed into the collector 22 and the fin structure 23 by a method to be described later.

To assembly the cooling module 2100 into the computer, as shown in FIG. 19, a flat fan motor 2200 is mounted on a fin structure 23 by means of screws, for example. An MPU package 2301 of an MPU module 2300 is electrically and mechanically connected to a mother board 2201 by means of connectors 2202 errected on the mother board. The flat surface of the collector 22 is bonded on the upper surface of the MPU package 2301 of the MPU module 2300 by means of a double-coated tape 2302 having a good heat conduction.

The MPU package 2301 and a group of peripheral ICs 2303 as well are mounted on the MPU module 2300. Some of the peripheral ICs 2303 require heat radiation parts attached thereto. However, since those ICs are thermally attached to the MPU package 2301, heat radiation from those ICs is accelerated.

It will readily be understood that the cooling capability of the cooling module could be improved if the fan motor 2200 is disposed just above the MPU package 2301. However, such a layout of the fan motor 2200 is rejected in a practical stage by some restrictions: the housing has a limited thickness; the coupling of the MPU package 2301 to the collector 22 is required; and the heat-resistance performance of the drive IC for and the bearing of the fan motor 2200 is designed to be below 60° C.

The heat pipe 12 is used for improving the cooling capability. Material of the plate 24 is aluminum, and its dimensions are 50 mm (wide)×100 mm (long)×1.0 mm (high). The plate 11 receives heat about 15W from the MPU module 2300; however, the thermal conductivity of the plate is unable to transfer the received heat of such an amount as to fully utilize the cooling capability of the fan motor 2200. The flat heat pipe 21 of 1 mm thick and 9 mm wide is embedded in the plate 24 while being arrayed parallel to the latter. The heat pipe 21 ranges from collector 22 to the fin structure 23. The thus embedded heat pipe 21 is capable of dispersing the heat received from the MPU module 2300 over the substantially entire surfaces of collector 22, the plate 24, and the fin structure 23. In the structure of the cooling module, the temperature of the heat exchanging is somewhat lower than the temperature of the heat exchanging in the case where the fan motor 2200 is directly attached to the MPU module 2300. However, the cooling module, because of its increased heat exchanging area, exhibits an excellent cooling capability even if it is assembled into a hot object thick-reduction oriented in design.

Figure 20A:
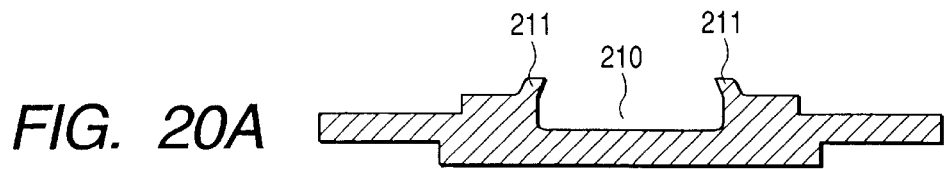
FIGS. 20A and 20B are cross sectional views showing a collector into which a heat pipe is embedded.
Figure 20B:
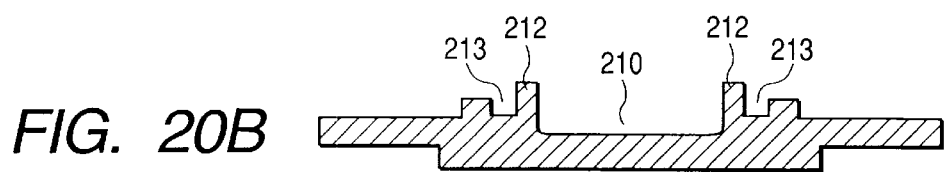
Figure 22:
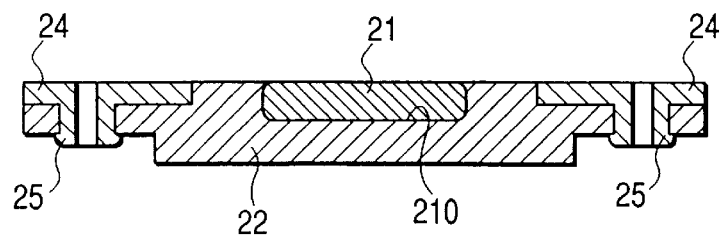
FIG. 22 is a cross sectional view taken on line A—A in FIG. 18.

Exemplary configurations of the flat heat pipe 21 embedded into the collector 22 and the fin structure 23, and exemplary methods to embed the former into the latter, and the embedding of the heat pipe 21 into the plate 24 are shown in FIGS. 20A and 20B, and FIG. 22.

Two examples of the collector 22 or fin structure 23 are illustrated in FIGS. 20A and 20B. The cross sections of the collector 22 (fin structure 23) are configured as shown before the heat pipe 21 is embed into the collector 22 (fin structure 23). The collector 22 configured as shown in FIG. 20A may be formed by an aluminum, extrusion molding process, and the collector 22 configured as shown in FIG. 20B is formed preferably by a die casting molding process.

In the case of FIG. 20A, burr-like protrusions 211 are formed at and along the edges of a groove 210 of the collector 22. To fix the heat pipe 21 into the collector 22 (fin structure 23), the heat pipe 21 is inserted into the latter, and the resultant structure is pressed to crush the protrusions 211.

In the case of FIG. 20B, a groove 210 is formed in the collector 22 while being axially extended, as in the case of FIG. 20A. However, in this case, it is impossible to form protrusions 212 in a state that those extend to the groove 210. Therefore, small grooves 213 are formed outside and along the protrusions 212 of the groove 210. The width of each small groove 213 is substantially equal to that of each protrusion 212. To embed the heat pipe 21 into the collector 22 or the fin structure 23, the heat pipe 21 is fit into the groove 210, and the resultant is pressed. By pressing, the protrusions 212 are crushed to equally extend to the upper corners of the heat pipe 21 and the small grooves 213.

FIG. 22 is a cross section taken on line A—A in FIG. 18. The groove 210 of the collector 22 is designed so as to receive the heat pipe 21 in a well fitting fashion. After the heat pipe 21 is fit into the groove 210, the protrusions 211 (FIG. 20A) are crushed, by pressing, on the curved, corner edges of the heat pipe 21. As a result, the heat pipe 21 is embedded into the collector 22 in a state that the upper surface of the heat pipe 21 is flush with the upper surface of the collector 22. The fin structure 23 has the same structure as of the collector 22. Accordingly, the heat pipe 21 is embed into the fin structure 23 in a similar way.

An assembly shown in FIG. 21A is the result of fixing the heat pipe 21 into the fin structure 23. A plate 24 is illustrated in FIG. 21B. As shown, the plate 24 includes a cut-out hole 240. This hole is provided for receiving flat protrusions 220 and 230 of the collector 22 and the fin structure 23. Holes 221 of the collector 22 are designed so as to receive the burring bosses 25 of the plate 24. The plate 24 includes fixing holes 241 for the counter-sunk screws 26 for fixing the fin structure 23. The assembly of FIG. 20A and the plate 24 are coupled together into the cooling module 2100 shown in FIG. 18. FIG. 18 illustrates the thus assembled module in an reversed state.

Figure 21:
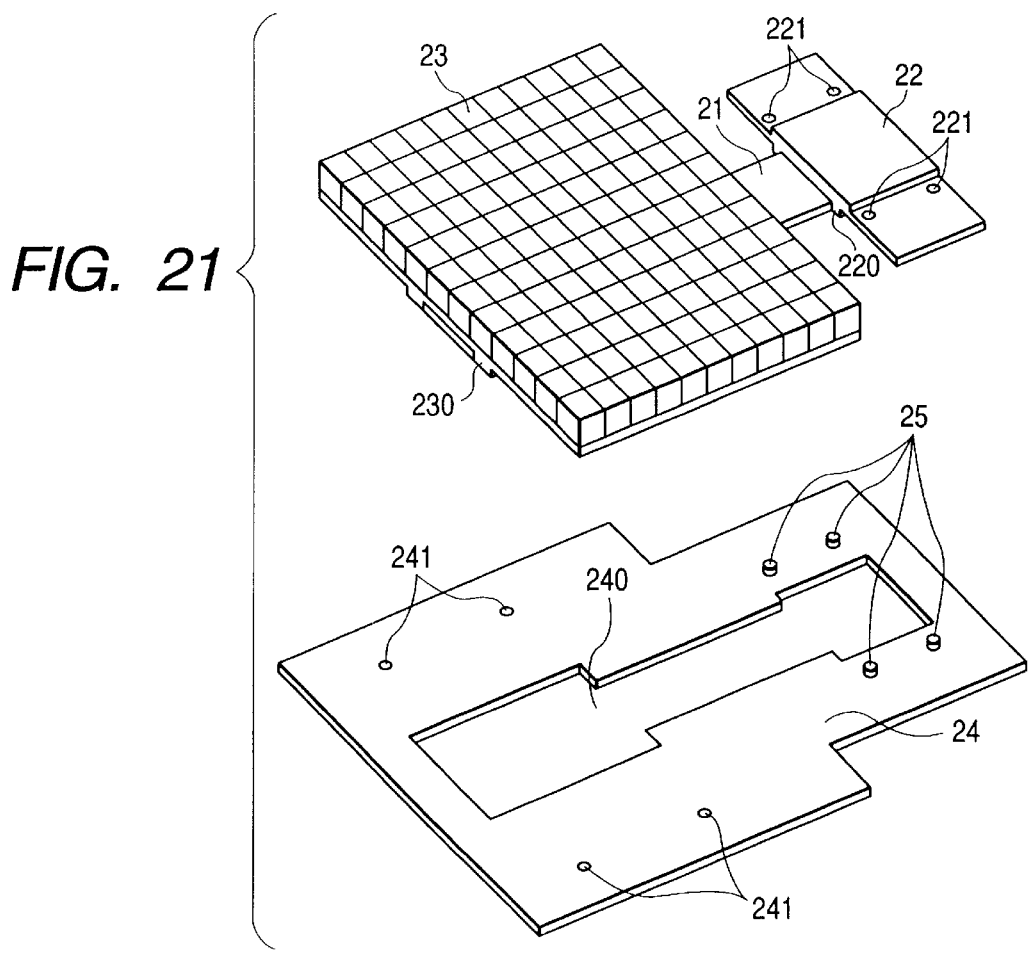
FIG. 21 is a perspective view showing a cooling module of the 5th embodiment before it is assembled.

The assembly of FIG. 21 has a satisfactory cooling function. However, the assembly is combined with the plate 24. This is because 1) the heat pipe 21, extremely thin, needs to be reinforced, and 2) the mounting positions used when the assembly is mounted on-the MPU module 2300b needs to be secured. Therefore, the plate 24 may be thinned unless it loses a necessary mechanical strength.

Figure 23:
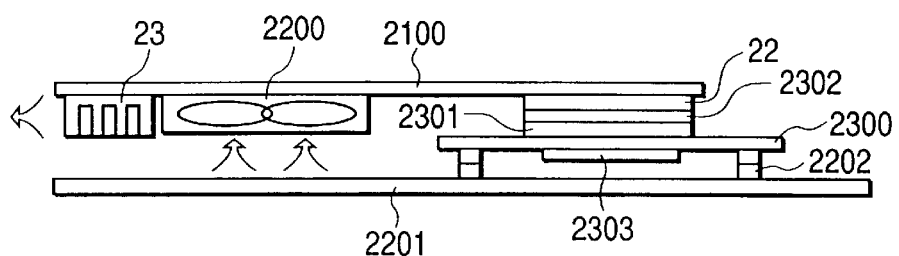
FIG. 23 is a side view showing the 6th embodiment of the present invention.
Figure 24:
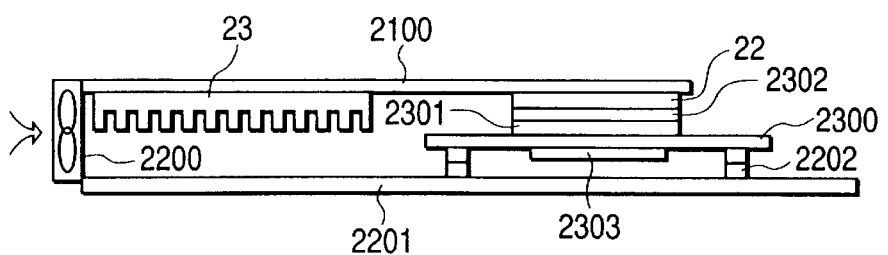
FIG. 24 is a side view showing a seventh of the present invention.
Figure 25:
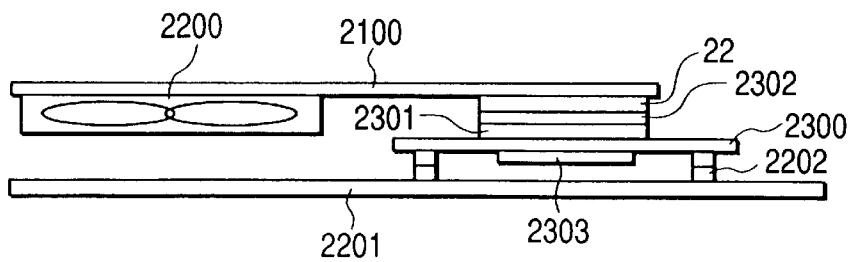
FIG. 25 is a side view showing the 8th embodiment of the present invention.
Figure 26:
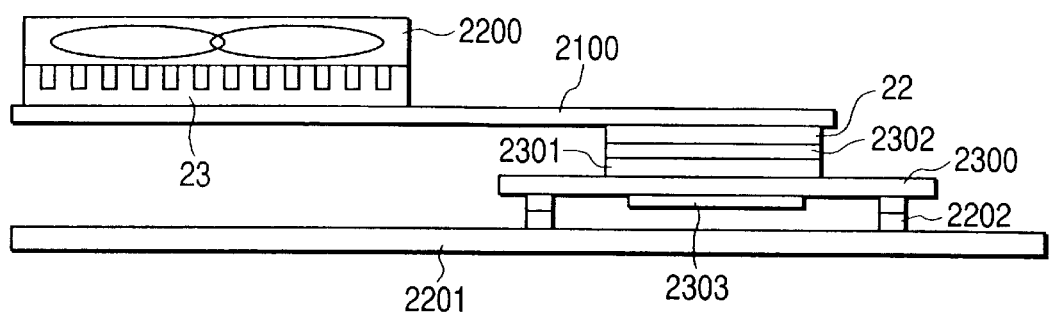
FIG. 26 is a side view showing the 9th embodiment of the present invention.

Other embodiments of the present invention are illustrated in FIGS. 23 through 26. The 6th embodiment of FIG. 23 is arranged such that the fin structure 23 is reduced in width, and a fan motor 2200 capable of causing a directional air flow is mounted on the plate 24. The 7th embodiment of FIG. 24 is such that the flat fan motor 2200 is not directly mounted on the fin structure, but is mounted on a housing (not shown). The 8th embodiment of FIG. 25 is such that the base of the flat fan motor 2200 is metal, and is directly coupled to the heat pipe 21 and the plate 24. Therefore, the embodiment succeeds in reducing the structure thickness. The 9th embodiment of FIG. 26 is such that the collector 22 and the fin structure 23 are mounted on the surface of the plate 24 opposite to its surface including the heat pipe 21. The collector 22 and the fin structure 23 may also be mounted in this way.

Figure 27:
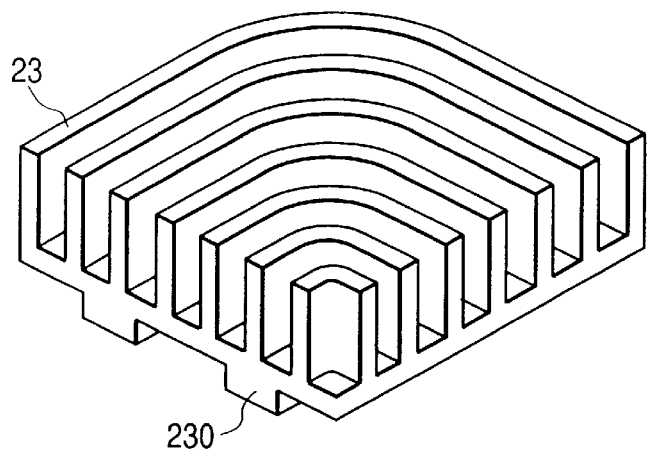
FIG. 27 is a perspective view showing another fin structure.

In the above-mentioned embodiments, the fin structure is constructed with a number of fin elements. This type of fin structure is effectively operable when is it applied to a structure where it is impossible to gather the fan air flow into an air path or paths. The gathering of the air flow into specific paths frequently increases the air flow. A fin structure shown in FIG. 27 is constructed including a plurality of air flow paths. The fin structure produces a directional air flow.

The above-mentioned embodiments including typically the 6th embodiment shown in FIG. 23 may have additional functions. Those functions are to suppress air-flow noise, to reduce the electric power consumped by the fan motor, and to suppress temperature rise of the motor bearing and its drive circuit.

Figure 28:
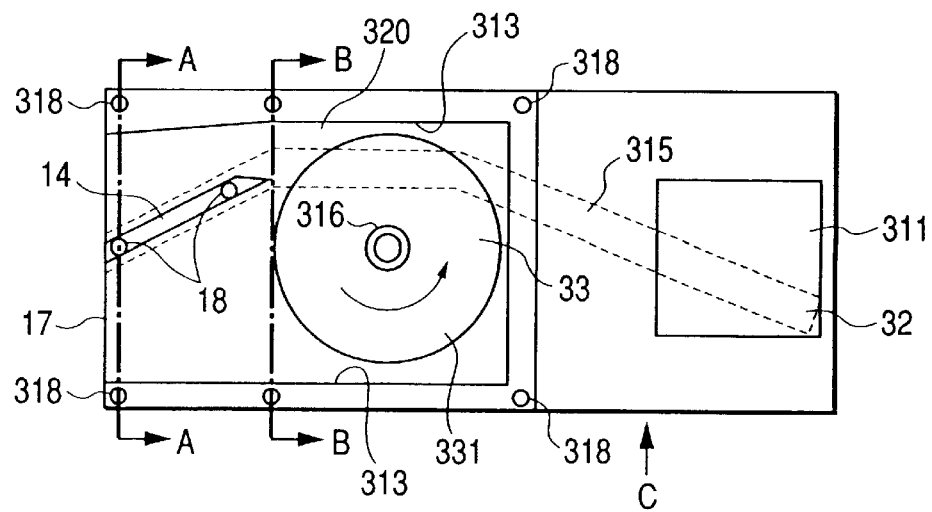
FIG. 28 is a plan view showing a cooling module which is the 10th embodiment of the present invention.
Figure 29:
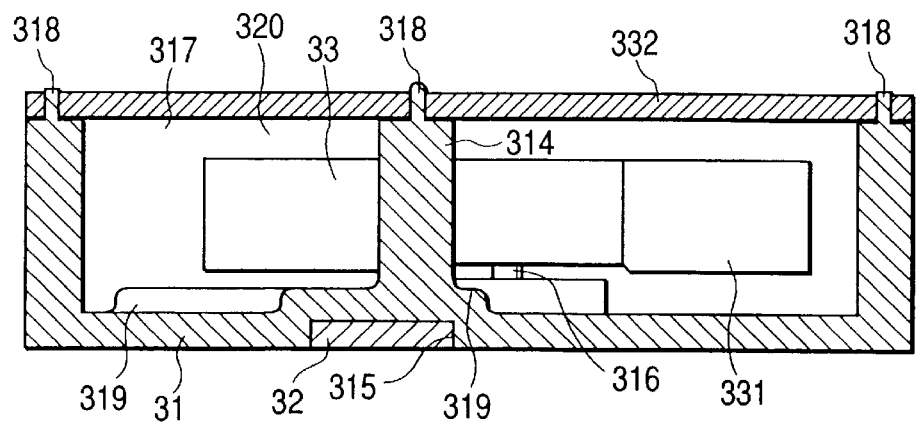
FIG. 29 is a cross sectional view taken on line A—A in FIG. 28 when viewed in the arrow direction.
Figure 30:
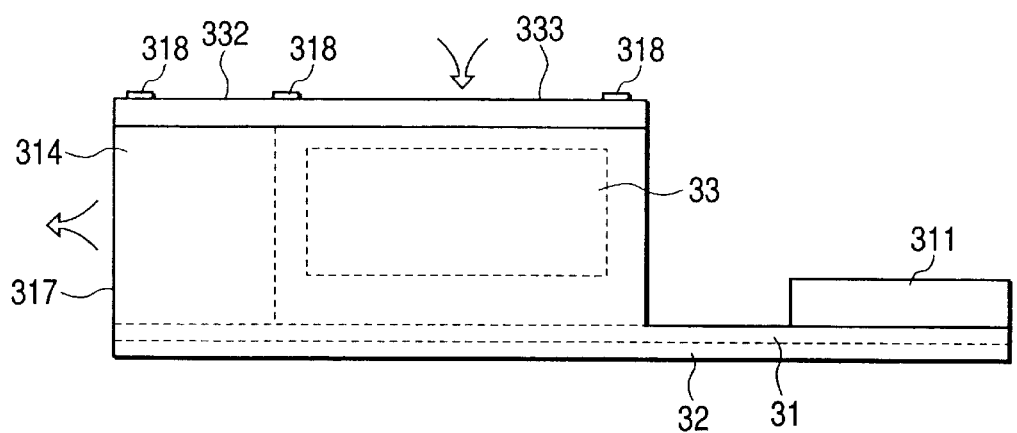
FIG. 30 is a side view showing the FIG. 28 cooling module when viewed in the direction C.
Figure 32:
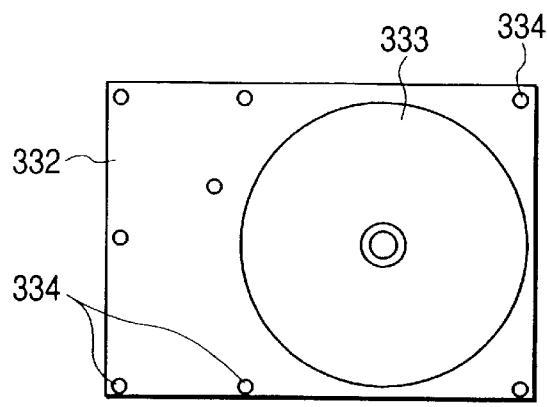
FIG. 32 is a plan view showing a cover attached by means of bosses shown in the FIG. 28.

The 9th embodiment of the present invention is shown in FIGS. 28 to 30. FIG. 28 is a plan view showing the 10th embodiment. FIG. 29 is a cross sectional view taken on line A—A in FIG. 28 when viewed in the arrow direction or a front view of a duct 320 continuous to the exhausting port of a fan motor 33. The duct 320 serves also as a fin structure 314. FIG. 30 is a cross sectional view taken on line B—B in FIG. 28 when viewed in the arrow direction. FIG. 32 is a plan view showing a cover applied and fastened to the cooling module of FIG. 28 with the aid of bosses.

As shown in FIGS. 28 through 32, the cooling module of the embodiment includes a collector 311 and a fan motor 333. The collector 311 is brought into close contact with a heat generating object (not shown), and receives heat from the latter. The fan motor 333 serves as an air blower. A fin structure 314 is mounted on a plate 31. An air guide 313 is disposed surrounding the fan motor 333 and the fin structure 314. The air guide 313 is opened at one side to an exhausting port 317, and the remaining sides thereof are closed. The air guide 313 is extended to the exhausting port 317, and includes bosses 318 for fastening a cover 332 having an opening corresponding in position to blades 331 of the fan motor 333. The bosses 318 are formed in the top of the fin structure 314.

In the above-mentioned embodiment, the fin structure 314 is located outside the air guide 313. It may be located inside the air guide 313 if the air guide 313 is elongated. In the illustrated embodiment, the fin structure 314 forms a part of the plate 31. If required, it may be a separate part, or separately formed from the plate 31.

A groove 315 is formed in the lower surface of the plate 31. A heat pipe 32 is embedded into this groove 315. The groove 315 ranges from a portion of the plate under the fin structure 314 to a portion under the collector 311, while making a detour around a bearing 316 of the fan motor 333. The plate 31 provides a base 312 for the collector 311 and the fan motor 33, and the air guide 313. The fin structure 314 is formed in the central portion thereof in the vicinity of the exhausting port 317.

Figure 31:
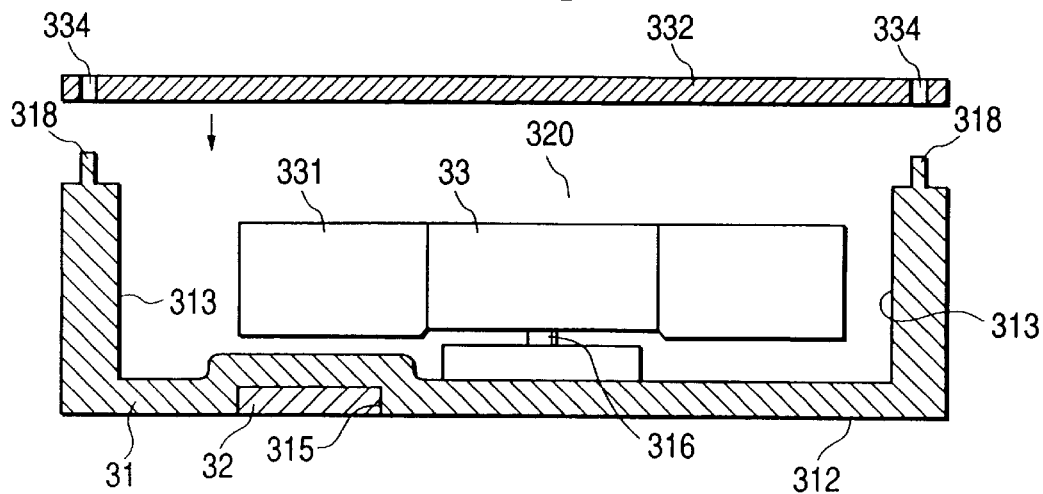
FIG. 31 is a cross sectional view taken on line B—B in FIG. 28 when viewed in the arrow direction.

As shown in FIGS. 29 to 31, the cover 332 is located on the upper surface of the air guide 313 (FIG. 28). FIG. 32 shows a plan view of the cover 332. As shown, the cover 332 entirely covers the air guide 313. The cover includes an opening for the fan motor 333. The cover 332 includes mounting holes 334 corresponding in position to the bosses 318 of the fin structure 314. When the cover 332 is applied to the air guide 313, the mounting holes 334 of the cover 332 are fit to those bosses 318, and the tips of the bosses are crushed by pressing. The lower surface of the resultant structure is defined by the plate 31; the side surfaces are defined by the air guide 313; and the upper surface is defined by the cover 332. One of the side surfaces is opened to form the exhausting port 317. Therefore, an air flow caused by the fan motor 33 has a direction in the thus formed duct 320. The cover 332 is coupled to the upper end of the fin structure 314 extended from the plate 31 by means of the bosses 318. With this structure, heat is transferred from the fin structure 314 to the central portion of the cover 332. Then, the cover 332 may be utilized as a part of the mounting holes 334, thereby increasing the radiation area and hence improving a heat radiation efficiency. For this reason, the cover 332, the plate 31 and the air guide 313 as its constituent components are made of a material of good heat conduction, such as copper, aluminum or iron.

With the structure where the heat pipe 32 is embedded into the groove 315 of the plate 31, the heat pipe 32 receives heat from the collector 311 and disperses over the whole duct 320 including plate 31 and the cover 332. Further, projections and protruded stepped parts, which impede the air flow caused by the fan motor 33, are minimized in the structure. The duct 320 surrounded by high temperature air exhibits a less impedance to the air flow, and is able to supply much air flow without increasing the drive current. Therefore, the resultant cooling module can satisfy cooling requirements while generating less noise.

Figure 33:
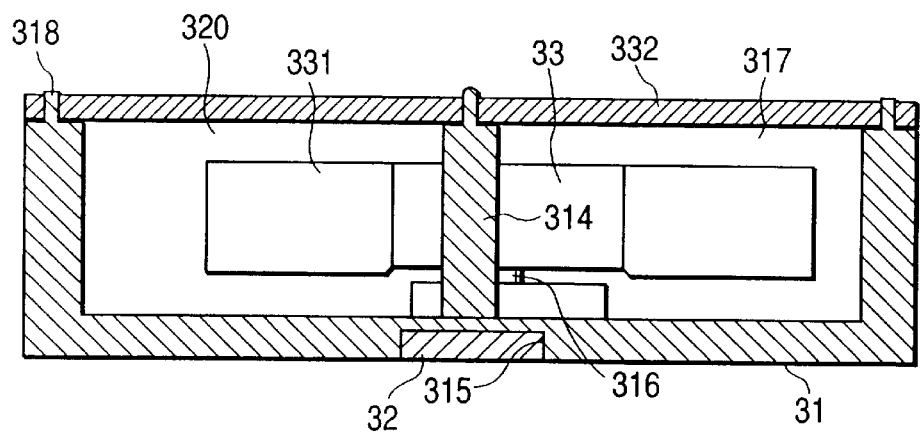
FIG. 33 is a cross-sectional view showing a cooling module which is the 11th embodiment of the present invention.
Figure 34:
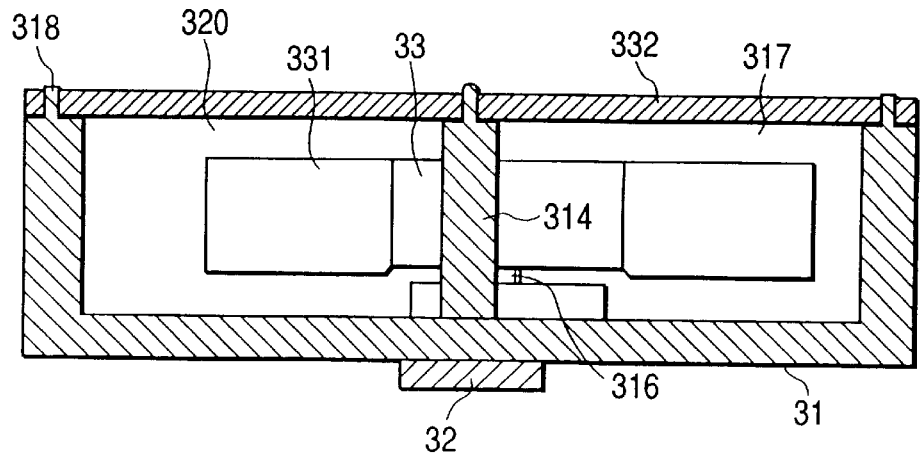
FIG. 34 is a cross-sectional view showing a cooling module which is the 12th embodiment of the present invention.

Additional embodiments of the invention will be described with reference to FIGS. 33 and 34. FIGS. 33 and 34 are front views of ducts 320 which form the 11th and the 12th embodiments of the invention. In each of those embodiments, the heat pipe 32 is mounted at the duct 320 in different way. In the 10th embodiment shown in FIG. 29, to form the groove 315 for receiving the heat pipe 32, the stepped portion 319 is essentially formed in a portion of the plate 31 including the duct 320. In the 11th embodiment, the stepped portion 319 is eliminated by use of a thin heat pipe 32. With this, air resistance to the air flow is lessened.

In the 12th embodiment of FIG. 34, a flat heat pipe 32 is bonded to a proper position of the plate 31. The groove 315 is not used. The thickness of the resultant cooling module is somewhat increased; however, less restriction is imposed on the bonding of the heat pipe 32 since the stepped portion 319 is not formed.

Burr-like protrusions are formed at and along the edges of the groove 315 of the plate 31. The groove 315 is precisely dimensioned so as to receive the heat pipe 32 in a well fitting fashion. The heat pipe 32 may be embedded into the plate 31 in a simple manner that the heat pipe is fixed into the groove, and the resultant is pressed. After pressed, the protrusions are crushed to extend to the rounded, upper corners of the heat pipe 32.

In the embodiment of FIG. 34, the heat pipe 32 may be mounted onto the plate 31 by known epoxy adhesive, partially embedding, or by use of separate mounting pieces, such as screws.

In the 11th and the 12th embodiments, other portions than those described above are substantially equal to those described referring to FIGS. 28 through 32. Hence, description of them is omitted.

In the 1st to the 4th embodiments, a small and thin cooling module is realized by embedding a flat heat pipe into a plate. Therefore, the cooling module can effectively cool such an MCM as an MPU module whose operating speed is increasing month by month. In the 5th to the 9th embodiment, a flat heat pipe is embedded into at least a collector, and fit into a plate partially cut out. Each of those embodiments successfully provides a small and thin cooling module of which the thickness except its major portion is reduced to be equal to the thickness of the heat pipe. Protrusions impedes an air flow and hinders a layout of other electronic parts are not contained in such a structure. Heat generating parts are located within the housing of a limited space, the cooling module, if assembled, can efficiently discharge the generated heat out of the housing.

In the 10th to the 12th embodiments, a fin structure occupies a part of a plate and a cover, which form a duct for a directional fan motor. Heat is transferred to a region near the fin structure by a heat pipe. A cooling module of each of those embodiments is small and thin, ensures a smooth air flow, consumes low electric power, generates less noise, is operable with high performances, and is capable of discharging heat out of the housing.

What is claimed is:

1. A cooling module comprising:
   a collector for receiving heat from a heat generating object, a fan motor capable of causing a directional air flow, and blades and a fin structure which are disposed on a plate,
   an air guide disposed surrounding at least said fan motor and said blades on said plate, and
   a cover applied to said air guide so as to form a duct,
   a heat pipe and a groove for receiving said heat pipe provided on and in the lower surface of said plate, while making a detour around a position used for mounting said motor fan, said heat pipe and said groove ranging from said collector to said duct, and
   a cover made of good heat conduction applied to the upper side of said fin structure.

* * * * *